United States Patent
Matsutori

(10) Patent No.: US 11,335,576 B2
(45) Date of Patent: May 17, 2022

(54) METHOD FOR MOLDING SUBSTRATE STORING CONTAINER, MOLD, AND SUBSTRATE STORING CONTAINER

(71) Applicant: MIRAIAL CO., LTD., Tokyo (JP)

(72) Inventor: Chiaki Matsutori, Tokyo (JP)

(73) Assignee: Miraial Co., Ltd., Tokyo (JP)

( * ) Notice: Subject to any disclaimer, the term of this patent is extended or adjusted under 35 U.S.C. 154(b) by 0 days.

(21) Appl. No.: 16/980,298

(22) PCT Filed: Oct. 29, 2018

(86) PCT No.: PCT/JP2018/040192
§ 371 (c)(1),
(2) Date: Sep. 11, 2020

(87) PCT Pub. No.: WO2020/089986
PCT Pub. Date: May 7, 2020

(65) Prior Publication Data
US 2021/0013073 A1 Jan. 14, 2021

(51) Int. Cl.
*H01L 21/67* (2006.01)
*G03F 7/20* (2006.01)
*H01L 21/673* (2006.01)

(52) U.S. Cl.
CPC ........ *H01L 21/67265* (2013.01); *G03F 7/708* (2013.01); *G03F 7/70691* (2013.01); *H01L 21/67383* (2013.01)

(58) Field of Classification Search
CPC .............. G03F 7/70691; G03F 7/708; H01L 21/67265; H01L 21/67379; H01L 21/67383; H01L 21/67386
See application file for complete search history.

(56) References Cited

U.S. PATENT DOCUMENTS

| | | | |
|---|---|---|---|
| 6,428,729 B1 | 8/2002 | Bhatt et al. | |
| 2006/0283774 A1 | 12/2006 | Hasegawa et al. | |
| 2009/0194456 A1 | 8/2009 | Fuller et al. | |
| 2015/0311098 A1* | 10/2015 | Cho | H01L 21/67383 206/711 |

(Continued)

FOREIGN PATENT DOCUMENTS

| | | |
|---|---|---|
| JP | 06181254 A | 6/1994 |
| JP | 4030280 B | 1/2008 |
| JP | 4150465 B2 | 9/2008 |

(Continued)

*Primary Examiner* — Peter B Kim
(74) *Attorney, Agent, or Firm* — Muncy, Geissler, Olds & Lowe, P.C.

(57) ABSTRACT

There is provided a method for molding a substrate storing container 1 including a container main body molding step of molding a container main body 2 in a state where a direction P2 perpendicular to a plane P1 passing through the entire periphery of an end edge of an opening circumferential portion 28 of the container main body 2 is inclined in a direction forming a predetermined angle a2, with respect to a horizontal direction L1 which is a movement direction of the movable die M1 with respect to the fixed die M2, and a pullout step of pulling the container main body 2 molded in the mold space M0 out from the movable die M1 by moving the movable die M1 so as to retreat from the fixed die M2.

8 Claims, 6 Drawing Sheets

(56) References Cited

U.S. PATENT DOCUMENTS

2020/0279761 A1\* 9/2020 Ogawa .............. H01L 21/67379

FOREIGN PATENT DOCUMENTS

| JP | 2009543374 | A | 12/2009 |
| JP | 4584023 | B2 | 11/2010 |
| JP | 20141992230 | A | 10/2014 |
| JP | 2016186967 | A | 10/2016 |
| WO | WO-2008/008270 | A2 | 1/2008 |
| WO | WO-2018/179324 | A1 | 10/2018 |

\* cited by examiner

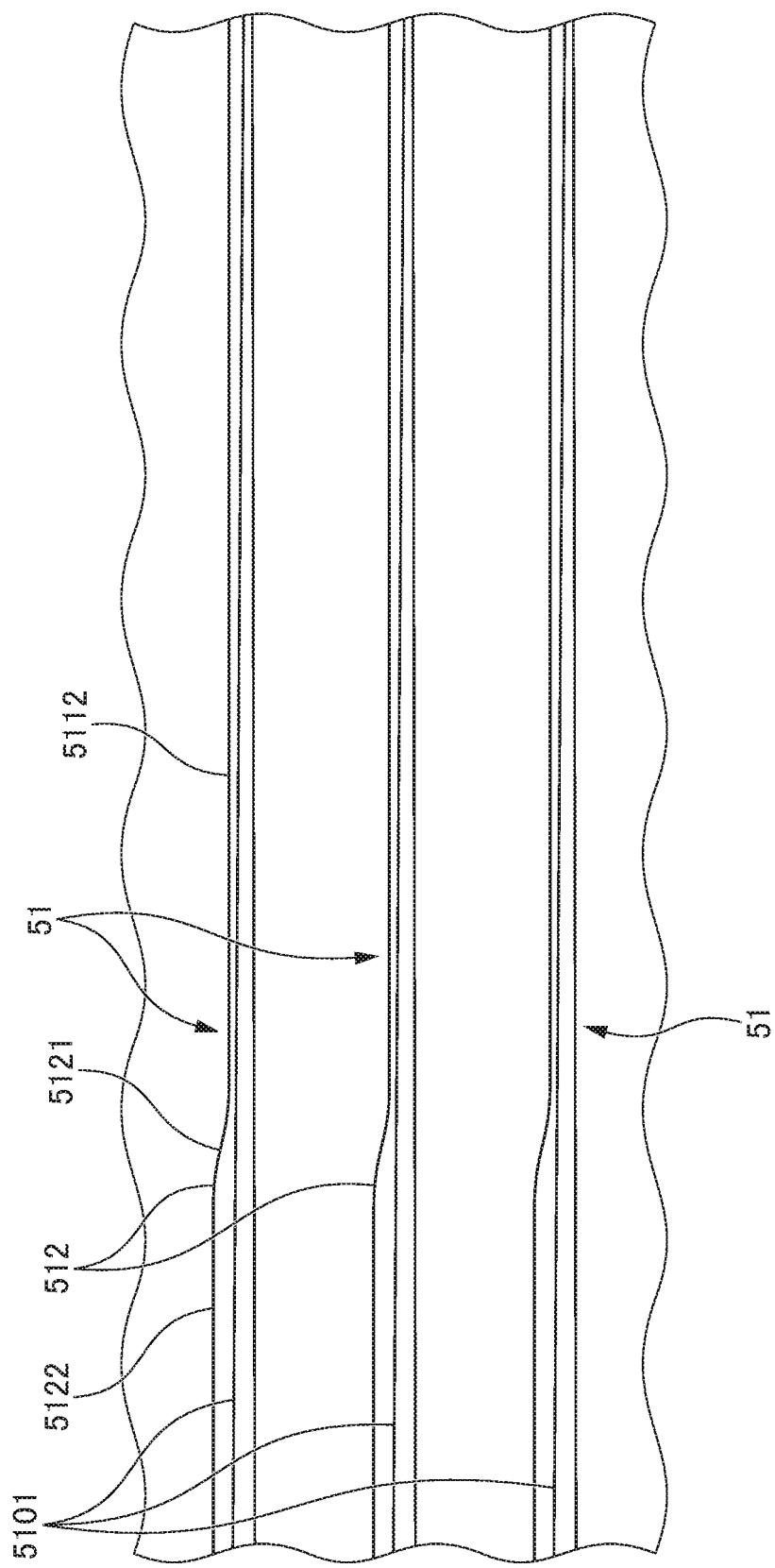

METHOD FOR MOLDING SUBSTRATE STORING CONTAINER, MOLD, AND SUBSTRATE STORING CONTAINER

TECHNICAL FIELD

The present invention relates to a method for molding a substrate storing container, a mold, and a substrate storing container which are used to store, keep, convey, or transport substrates formed of semiconductor wafers or the like.

BACKGROUND ART

In the related art, as a substrate storing container for storing and conveying substrates formed of semiconductor wafers in a factory process, there has been known a substrate storing container configured to include a container main body and a lid body (for example, refer to Patent Documents 1 to 4).

One end portion of the container main body has an opening circumferential portion in which a container main body opening portion is formed. The other end portion of the container main body has a tubular wall portion which is closed. A substrate storing space is formed inside the container main body. The substrate storing space is formed surrounded by the wall portion, and is capable of storing a plurality of substrates. The lid body is removably attached to the opening circumferential portion, and is capable of closing the container main body opening portion. Lateral substrate support portions are provided in the wall portion so as to form a pair in the substrate storing space. When the container main body opening portion is not closed by the lid body, the lateral substrate support portions are capable of supporting edge portions of the plurality of substrates in a state where the substrates adjacent to each other are arranged parallel to each other while spaced apart by a predetermined interval from each other.

A front retainer is provided in a part of the lid body which faces the substrate storing space when the container main body opening portion is closed. When the container main body opening portion is closed by the lid body, the front retainer is capable of supporting edge portions of the plurality of substrates. In addition, a back side substrate support portion is provided in the wall portion so as to form a pair with the front retainer. The back side substrate support portion is capable of supporting edge portions of the plurality of substrates. When the container main body opening portion is closed by the lid body, since the back side substrate support portion supports the plurality of substrates in cooperation with the front retainer, the back side substrate support portion retains the plurality of substrates in a state where the substrates adjacent to each other are arranged parallel to each other while spaced apart by a predetermined interval from each other.

Patent Document 1: Japanese Unexamined Patent Application, Publication No. 2016-186967
Patent Document 2: Japanese Patent No. 4584023
Patent Document 3: Japanese Patent No. 4030280
Patent Document 4: Japanese Patent No. 4150465

DISCLOSURE OF THE INVENTION

Problems to be Solved by the Invention

In the substrate storing container of the related art, it is necessary to place the substrate with respect to the lateral substrate support portion at an accurate position in each of X, Y, and Z directions. The reason is to prevent damages, scratches, or the like to the substrate when the substrate is frequently taken in and out from the substrate storing container by the device in the process of applying various treatments to the substrate to make semiconductor chips. Incidentally, in general, a protrusion is provided in a part of an upper face of the lateral substrate support portion on which the substrate is placed, which is a part in contact with the substrate, the position of the substrate is accurately adjusted by the protrusions, and the protrusion has a shape in which the protrusion is in point contact with or in several millimeter line contact with the substrate at an outer periphery of the substrate so as to minimize the area of contact with the substrate.

The substrate storing container is molded and manufactured by injection molding. Then, in order to form the protrusion described above, it is necessary to engrave the shape of a part corresponding to the protrusion into a part (for molding the lateral substrate support portion) of a mold for molding the substrate storing container. However, in the related art, in a substrate storing container in which the lateral substrate support portion is not integrally molded with the container main body, if it is intended that the lateral substrate support portion is integrally molded with an inner face of the container main body, when the container main body is removed from the mold, the protrusion becomes undercut. For this reason, if integral molding is employed, it is necessary to provide a slide structure in the mold.

If the slide structure is provided in the mold, the operation movement of the mold becomes complicated, and it is necessary to reduce a movement speed so as to prevent damages to the mold. As a result, there occurs a problem such as a prolonged molding cycle or a deterioration in production efficiency. In addition, since the structure of the mold becomes complicated, it becomes difficult to install an optimum cooling circuit, which circulates a coolant in the mold so as to absorb heat of a molten resin, in the mold at an optimum position, and thus there occurs a problem such as an extended cooling time.

An object of the present invention is to provide a method for molding a substrate storing container, a mold, and a substrate storing container with which it is possible to integrally mold a container main body with a lateral substrate support portion without providing a slide structure in the mold.

Means for Solving the Problems

The present invention relates to a method for molding a substrate storing container including a container main body inside which a substrate storing space capable of storing a plurality of substrates is formed, and which has an opening circumferential portion, in which a container main body opening portion is formed to communicate with the substrate storing space, in one end portion, a lid body removably attached to the opening circumferential portion, and capable of closing the container main body opening portion in a positional relationship where the lid body is surrounded by the opening circumferential portion, and lateral substrate support portions provided molded integrally with the container main body so as to form a pair in the substrate storing space, and capable of supporting edge portions of the plurality of substrates in a state where the substrates adjacent to each other among the plurality of substrates are arranged parallel to each other while spaced apart by a predetermined interval from each other when the container main body opening portion is not closed by the lid body, in which the lateral substrate support portion is formed into a plate shape extending in a direction connecting the container main body opening portion of one end portion of the container main body to the other end portion with respect to the one end portion of the container main body, and having an upper face and a lower face, in which an upper face of the lateral substrate support portion has a substrate contact portion in contact with the substrate when supporting the edge portion of the substrate, and in which the substrate contact portion has a bump, a peak portion of the bump is in contact with the substrate when supporting the edge portion of the substrate, and the container main body and the lateral substrate support portion are molded together, the method including a container main body molding step of molding the container main body in a mold space inside a mold having a fixed die and a movable die in a state where a direction perpendicular to a plane passing through the entire periphery of an end edge of the opening circumferential portion of the container main body is inclined in a direction forming a predetermined angle, with respect to a horizontal direction which is a movement direction of the movable die with respect to the fixed die; and a pullout step of pulling the container main body molded in the mold space out from the movable die by moving the movable die so as to retreat from the fixed die.

In addition, the bumps facing the container main body opening portion of one end portion of the container main body and the other end portion of the container main body are preferably formed by one end portion-side inclined face and the other end portion-side inclined face, respectively, which are flat faces. A direction where the other end portion-side inclined face of the bump in the container main body molded in the container main body molding step and present in the mold space is inclined with respect to the horizontal direction as a reference, and a direction where the direction perpendicular to the plane passing through the entire periphery of the end edge of the opening circumferential portion of the container main body in the mold space is inclined with respect to the horizontal direction as a reference are preferably inclined on the same side of the horizontal direction as a boundary line. In addition, the predetermined angle is preferably from 0.1° to 1°.

In addition, the present invention relates to a mold for molding a substrate storing container including a container main body inside which a substrate storing space capable of storing a plurality of substrates is formed, and which has an opening circumferential portion, in which a container main body opening portion is formed to communicate with the substrate storing space, in one end portion, a lid body removably attached to the opening circumferential portion, and capable of closing the container main body opening portion in a positional relationship where the lid body is surrounded by the opening circumferential portion, and lateral substrate support portions provided molded integrally with the container main body so as to form a pair in the substrate storing space, and capable of supporting edge portions of the plurality of substrates in a state where the substrates adjacent to each other among the plurality of substrates are arranged parallel to each other while spaced apart by a predetermined interval from each other when the container main body opening portion is not closed by the lid body, in which the lateral substrate support portion is formed into a plate shape extending in a direction connecting the container main body opening portion of one end portion of the container main body to the other end portion with respect to the one end portion of the container main body, and having an upper face and a lower face, in which an upper face of the lateral substrate support portion has a substrate contact portion in contact with the substrate when supporting the edge portion of the substrate, and in which the substrate contact portion has a bump, a peak portion of the bump is in contact with the substrate when supporting the edge portion of the substrate, and the container main body and the lateral substrate support portion are molded together, the mold including a fixed die; a movable die movable with respect to the fixed die; and a mold space which is formed inside the mold by the fixed die and the movable die, wherein the container main body is molded in a state where a direction perpendicular to a plane passing through the entire periphery of an end edge of the opening circumferential portion of the container main body is inclined in a direction forming a predetermined angle, with respect to a horizontal direction which is a movement direction of the movable die with respect to the fixed die.

In addition, the bumps facing the container main body opening portion of one end portion of the container main body and the other end portion of the container main body are preferably formed by one end portion-side inclined face and the other end portion-side inclined face, respectively, which are flat faces. A direction where the other end portion-side inclined face of the bump in the container main body present in the mold space is inclined with respect to the horizontal direction as a reference, and a direction where the direction perpendicular to the plane passing through the entire periphery of the end edge of the opening circumferential portion of the container main body present in the mold space is inclined with respect to the horizontal direction as a reference are preferably inclined on the same side of the horizontal direction as a boundary line. In addition, the predetermined angle is preferably from 0.1° to 1°.

In addition, the present invention relates to a substrate storing container including a container main body inside which a substrate storing space capable of storing a plurality of substrates is formed, and which has an opening circumferential portion, in which a container main body opening portion is formed to communicate with the substrate storing space, in one end portion; a lid body removably attached to the opening circumferential portion, and capable of closing the container main body opening portion in a positional relationship where the lid body is surrounded by the opening circumferential portion; and lateral substrate support portions provided molded integrally with the container main body so as to form a pair in the substrate storing space, and capable of supporting edge portions of the plurality of substrates in a state where the substrates adjacent to each other among the plurality of substrates are arranged parallel to each other while spaced apart by a predetermined interval from each other when the container main body opening portion is not closed by the lid body, in which the lateral substrate support portion is formed into a plate shape extending in a direction connecting the container main body opening portion of one end portion of the container main body to the other end portion with respect to the one end portion of the container main body, and having an upper face and a lower face, in which an upper face of the lateral substrate support portion has a substrate contact portion in contact with the substrate when supporting the edge portion of the substrate, in which the substrate contact portion has a bump, and a peak portion of the bump is in contact with the substrate when supporting the edge portion of the substrate, and in which the bumps facing the container main body opening portion of one end portion of the container main body and the other end portion of the container main body are formed by one end portion-side inclined face and the other end portion-side inclined face, respectively, which are flat faces.

In addition, a direction where the other end portion-side inclined face of the bump in the container main body is inclined with respect to a movement direction line as a reference which is formed parallel to a horizontal direction which is a direction where a movable die is moved after the container main body has been molded in a mold space inside a mold having a fixed die and the movable die, and a direction perpendicular to a plane passing through the entire periphery of an end edge of the opening circumferential portion of the container main body with respect to the movement direction line as a reference are preferably inclined on the same side of the movement direction line as a boundary line.

In addition, a predetermined angle is preferably formed by the movement direction line, and the direction perpendicular to the plane passing through the entire periphery of the end edge of the opening circumferential portion of the container main body. The predetermined angle is preferably from 0.1° to 1°.

Effects of the Invention

According to the present invention, it is possible to provide the method for molding a substrate storing container, the mold, and the substrate storing container with which it is possible to integrally mold the container main body with the lateral substrate support portion without providing a slide structure in the mold.

BRIEF DESCRIPTION OF THE DRAWINGS

FIG. 6 is an enlarged lateral view illustrating a plate portion 51 of a substrate support plate-like portion 5 of the substrate storing container 1 according to one embodiment of the present invention.

PREFERRED MODE FOR CARRYING OUT THE INVENTION

Figure 1:
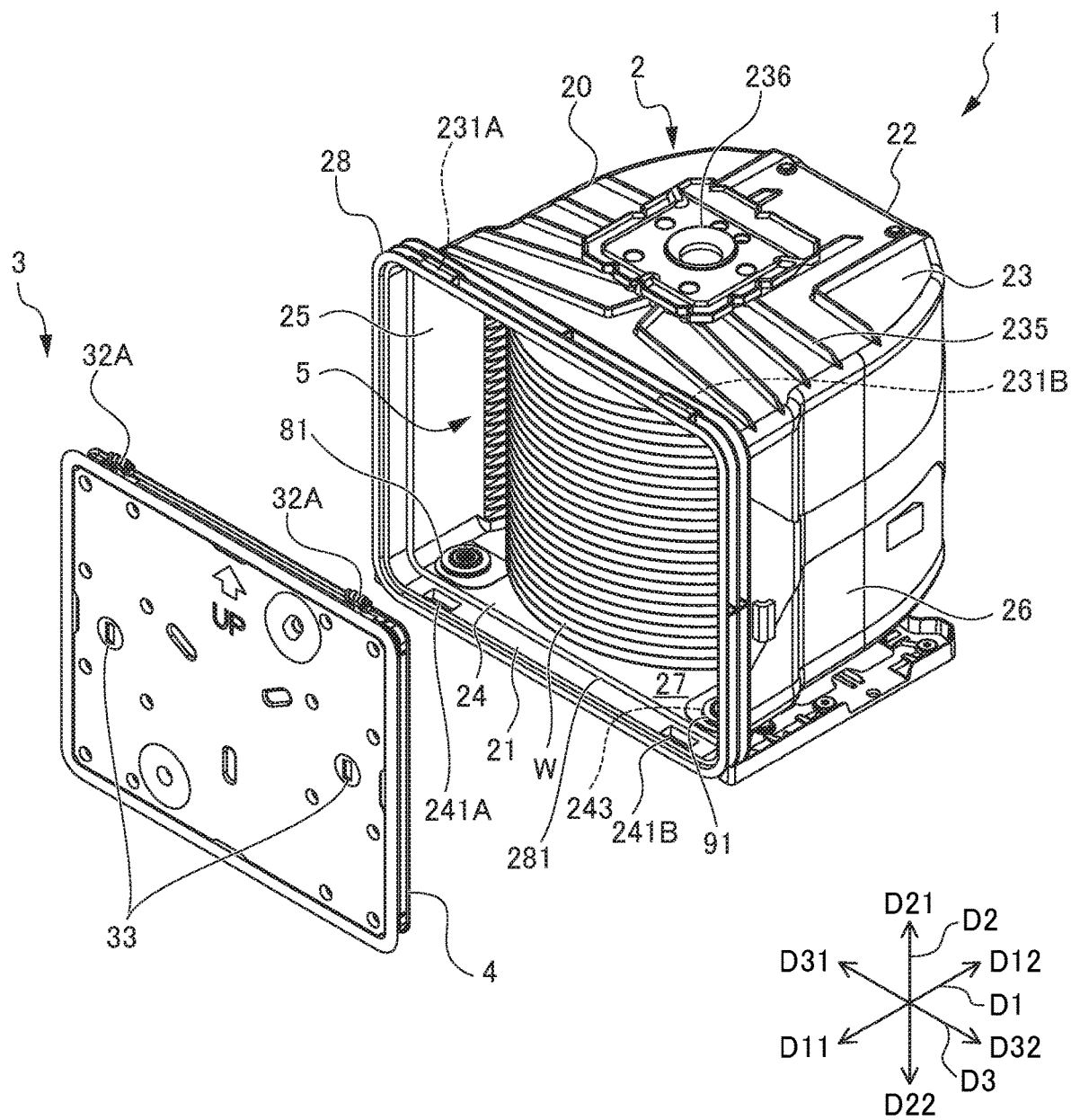
FIG. 1 is an exploded perspective view illustrating a state where a plurality of substrates W is stored in a substrate storing container 1 according to one embodiment of the present invention.
Figure 2:
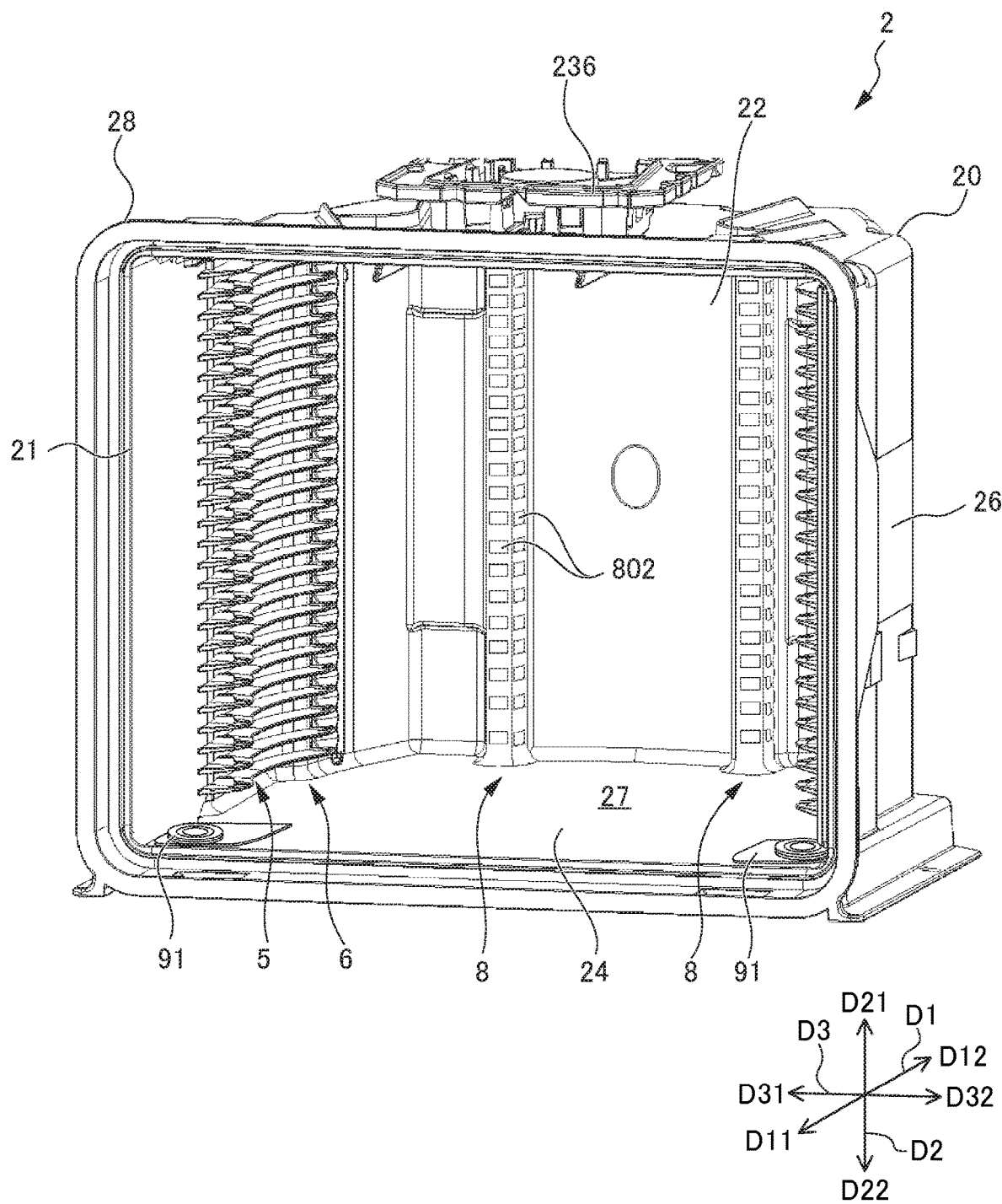
FIG. 2 is an upper perspective view illustrating a container main body 2 of the substrate storing container 1 according to one embodiment of the present invention.
Figure 3:
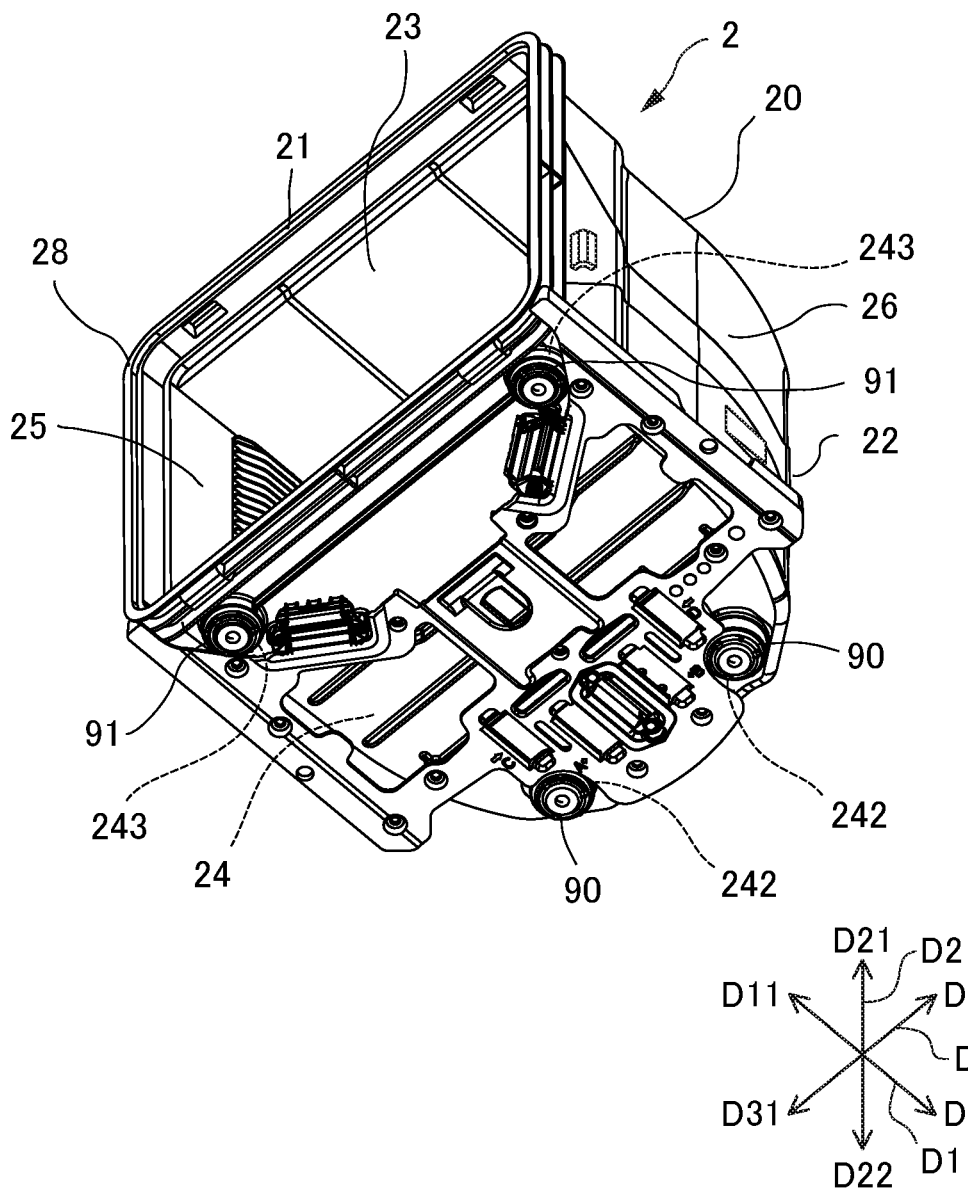
FIG. 3 is a lower perspective view illustrating the container main body 2 of the substrate storing container 1 according to one embodiment of the present invention.
Figure 4:
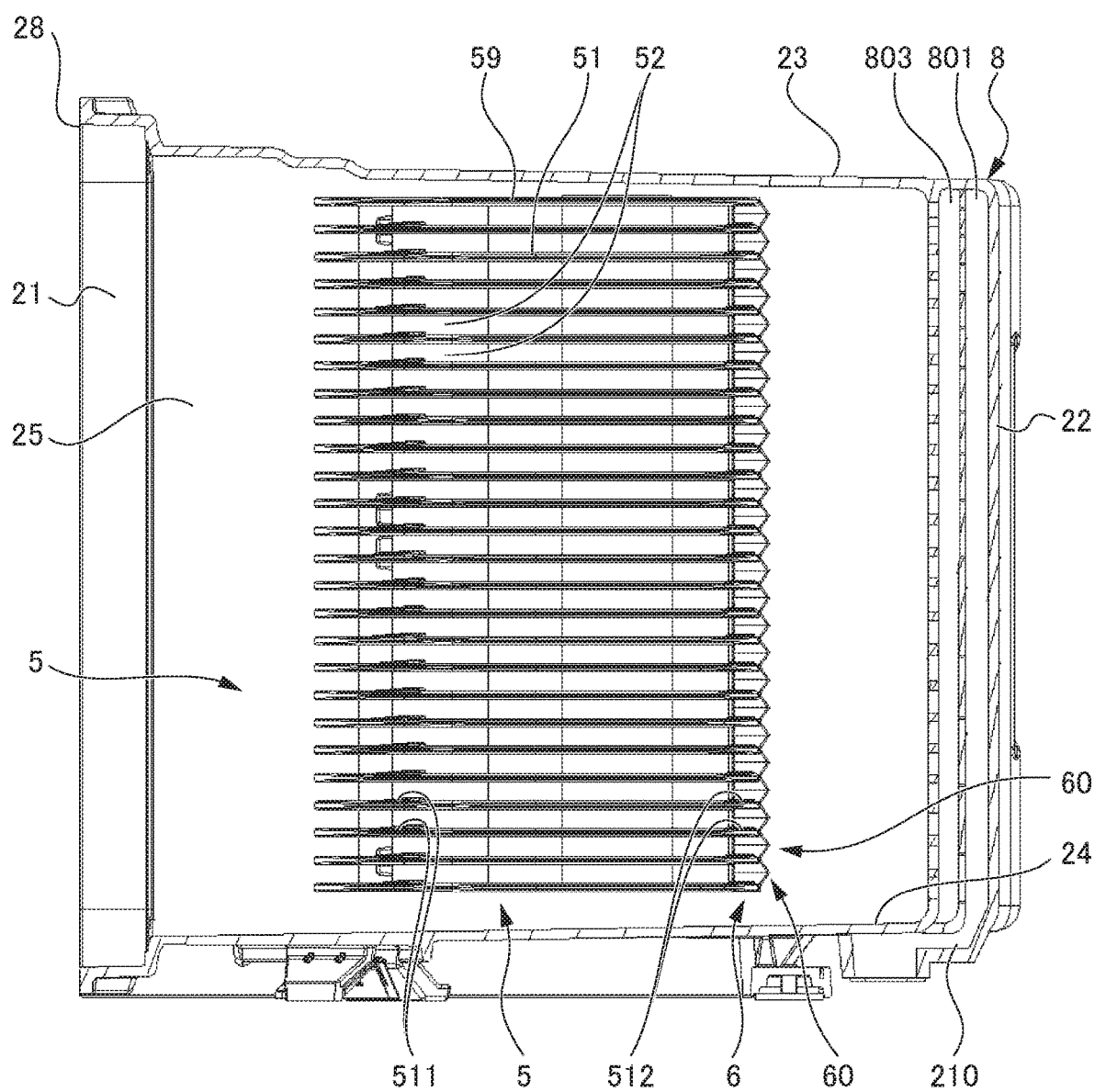
FIG. 4 is a lateral cross-sectional view illustrating the container main body 2 of the substrate storing container 1 according to one embodiment of the present invention.

Hereinbelow, a substrate storing container 1 and a mold M according to a first embodiment will be described with reference to the drawings. FIG. 1 is an exploded perspective view illustrating a state where a plurality of substrates W is stored in the substrate storing container 1. FIG. 2 is an upper perspective view illustrating a container main body 2 of the substrate storing container 1. FIG. 3 is a lower perspective view illustrating the container main body 2 of the substrate storing container 1. FIG. 4 is a lateral cross-sectional view illustrating the container main body 2 of the substrate storing container 1. It should be noted that in FIG. 4, for the sake of convenience, the illustration of a supply gas filter portion 90, a rib 235, and a top flange 236 is omitted.

Herein, for the purpose of explanation, a direction (direction from upper right toward lower left in FIG. 1) from the container main body 2 (to be described later) toward a lid body 3 (to be described later) is defined as a forward direction D11, and a direction opposite thereto is defined as a backward direction D12. The directions are collectively defined as a forward/backward direction D1. In addition, a direction (upper direction in FIG. 1) from a lower wall 24 (to be described later) toward an upper wall 23 (to be described later) is defined as an upper direction D21, and a direction opposite thereto is defined as a lower direction D22. The directions are collectively defined as an upper/lower direction D2. In addition, a direction (direction from lower right toward upper left in FIG. 1) from a second side wall 26 (to be described later) toward a first side wall 25 (to be described later) is defined as a left direction D31, and a direction opposite thereto is defined as a right direction D32. The directions are collectively defined as a left/right direction D3. In main drawings, arrows indicating the directions are illustrated.

In addition, a substrate W (refer to FIG. 1) stored in the substrate storing container 1 is a silicon wafer, a glass wafer, a sapphire wafer, or the like which has a disk shape, and is a thin wafer used in industrial applications. The substrate W in the present embodiment is a silicon wafer having a diameter of 300 mm.

As illustrated in FIG. 1, the substrate storing container 1 is used as an in-process container that stores and conveys the substrate W formed of the silicon wafer described above in a factory process, or is used as a shipping container for transporting the substrates with transport means such as ground transport means, air transport means, or marine transport means. The substrate storing container 1 is formed of the container main body 2 and the lid body 3. The container main body 2 includes a substrate support plate-like portion 5 as a lateral substrate support portion, and a back side substrate support portion 6 (refer to FIG. 2 and the like). The lid body 3 includes a front retainer (not illustrated) as a lid body side substrate support portion.

The container main body 2 has a tubular wall portion 20 in which a container main body opening portion 21 is formed in one end portion and the other end portion is closed. A substrate storing space 27 is formed inside the container main body 2. The substrate storing space 27 is formed surrounded by the wall portion 20. The substrate support plate-like portion 5 is provided in a part of the wall portion 20, which forms the substrate storing space 27. As illustrated in FIG. 1, a plurality of substrates W can be stored in the substrate storing space 27.

The substrate support plate-like portions 5 are provided molded integrally with the wall portion 20 so as to form a pair in the substrate storing space 27. When the container main body opening portion 21 is not closed by the lid body 3, the substrate support plate-like portions 5 are in contact with edge portions of the plurality of substrates W, and thus are capable of supporting the edge portions of the plurality of substrates W in a state where the substrates W adjacent to each other are arranged parallel to each other while spaced apart by a predetermined interval from each other. The back side substrate support portion 6 is provided molded integrally with the substrate support plate-like portion 5 on a back side of the substrate support plate-like portion 5.

The back side substrate support portion 6 (refer to FIG. 2 and the like) is provided molded integrally with the wall portion 20 so as to form a pair with the front retainer (not illustrated) to be described later in the substrate storing space 27. When the container main body opening portion 21 is closed by the lid body 3, the back side substrate support portions 6 are in contact with edge portions of the plurality of substrates W, and thus are capable of supporting rear portions of the edge portions of the plurality of substrates W.

The lid body 3 is removably attached to an opening circumferential portion 28 (FIG. 1 and the like) forming the container main body opening portion 21, and is capable of closing the container main body opening portion 21. The front retainer (not illustrated) is provided in a part of the lid body 3 which is facing the substrate storing space 27 when the container main body opening portion 21 is closed by the lid body 3. The front retainer (not illustrated) is disposed so as to form a pair with the back side substrate support portion 6 in the substrate storing space 27.

When the container main body opening portion 21 is closed by the lid body 3, the front retainer (not illustrated) is in contact with edge portions of the plurality of substrates W, and thus is capable of supporting front portions of the edge portions of the plurality of substrates W. When the container main body opening portion 21 is closed by the lid body 3, the front retainer (not illustrated) supports the plurality of substrates W in cooperation with the back side substrate support portion 6, and thus retains the plurality of substrates W in a state where the substrates W adjacent to each other are arranged parallel to each other while spaced apart by a predetermined interval from each other.

The substrate storing container 1 is made of resin such as plastic materials. If not specifically described, examples of the resin material include thermoplastic resins such as polycarbonate, cycloolefin polymer, polyetherimide, polyetherketone, polybutylene terephthalate, polyetheretherketone, and liquid crystal polymer, and alloys thereof. If conductivity is intended to be given to the molding resin materials, conductive substances such as carbon fibers, carbon powder, carbon nanotubes, and conductive polymers are selectively added thereto. In addition, glass fiber, carbon fibers, or the like also can be added to improve rigidity.

Hereinbelow, each portion will be described in detail. As illustrated in FIG. 1, the wall portion 20 of the container main body 2 has a back wall 22; the upper wall 23; the lower wall 24; the first side wall 25; and the second side wall 26. The back wall 22, the upper wall 23, the lower wall 24, the first side wall 25, and the second side wall 26 are made of the materials described above, and are formed by integral molding.

The first side wall 25 faces the second side wall 26, and the upper wall 23 faces the lower wall 24. A rear end of the upper wall 23, a rear end of the lower wall 24, a rear end of the first side wall 25, and a rear end of the second side wall 26 are all connected to the back wall 22. A front end of the upper wall 23, a front end of the lower wall 24, a front end of the first side wall 25, and a front end of the second side wall 26 form the opening circumferential portion 28 forming the container main body opening portion 21 having substantially a rectangular shape.

The opening circumferential portion 28 is provided in one end portion of the container main body 2, and the back wall 22 is positioned in the other end portion of the container main body 2. The profile of the container main body 2 formed by outer faces of the wall portion 20 is a box shape.

Inner faces of the wall portion 20, namely, an inner face of the back wall 22, an inner face of the upper wall 23, an inner face of the lower wall 24, an inner face of the first side wall 25, and an inner face of the second side wall 26 form the substrate storing space 27 surrounded thereby. The container main body opening portion 21 formed in the opening circumferential portion 28 communicates with the substrate storing space 27 that is surrounded by the wall portion 20 and is formed inside the container main body 2. A maximum of 25 substrates W can be stored in the substrate storing space 27.

As illustrated in FIG. 1, latch engagement concave portions 231A, 231B, 241A, and 241B, which are concave outwardly from the substrate storing space 27, are formed in parts of the upper wall 23 and the lower wall 24 which are in the vicinity of the opening circumferential portion 28. A total of four latch engagement concave portions, specifically, one latch engagement concave portion 231A, one latch engagement concave portion 231B, one latch engagement concave portion 241A, and one latch engagement concave portion 241B are formed in the vicinities of both right and left end portions of the upper wall 23 and the lower wall 24, respectively.

As illustrated in FIG. 1, the rib 235 is provided molded integrally with the upper wall 23 on an outer face of the upper wall 23. The rib 235 improves the rigidity of the container main body 2. In addition, the top flange 236 is fixed to a central portion of the upper wall 23. The top flange 236 is a member that is a part of the substrate storing container 1 which is hooked and suspended when the substrate storing container 1 is suspended by an automated material handling system (AMHS), a person guided vehicle (PGV), or the like.

As illustrated in FIG. 3, supply gas holes 242 and exhaust gas holes 243 (refer to FIG. 1) which are two types of through-holes are formed as ventilation paths 210 (refer to FIG. 4) at four corners of the lower wall 24, respectively. In the present embodiment, through-holes at two places in a front portion of the lower wall 24 are the exhaust gas holes 243 for exhausting gas inside the container main body 2, and through-holes at two places in a rear portion are the supply gas holes 242 for supplying gas into the container main body 2. The supply gas filter portion 90 is disposed in a through-hole as the supply gas hole 242, and an exhaust gas filter portion 91 is disposed in a through-hole as the exhaust gas hole 243. Therefore, gas flow paths inside the supply gas filter portion 90 and the exhaust gas filter portion 91 form a part of the ventilation path 210 that enables the substrate storing space 27 to communicate with an external space of the container main body 2. In addition, the supply gas filter portion 90 and the exhaust gas filter portion 91 are disposed in the wall portion 20, and the gas is capable of passing through the supply gas filter portion 90 and the exhaust gas filter portion 91 between the external space of the container main body 2 and the substrate storing space 27.

The substrate support plate-like portions 5 are provided in the first side wall 25 and the second side wall 26, respectively, and are provided in the substrate storing space 27 so as to form a pair in the left/right direction D3. Specifically, as illustrated in FIG. 4 and the like, the substrate support plate-like portion 5 has a plate portion 51 formed into a plate shape which extends in a direction connecting the container main body opening portion 21 of one end portion of the container main body 2 to the back wall 22 of the other end portion with respect to one end portion of the container main body 2, and which has an upper face and a lower face. The plate portion 51, and the first side wall 25 and the second side wall 26 of the wall portion 20 of the container main body 2 are made of a resin material by integral molding. The plate portion 51 is supported by the first side wall 25 or the second side wall 26.

The plate portion 51 has the shape of a plate having substantially an arc shape. A total of 50 plate portions 51, specifically, 25 plate portions 51 and 25 plate portions 51 are provided in the first side wall 25 and the second side wall 26 in the upper/lower direction D2, respectively. The plate portions 51 adjacent to each other are disposed based on a positional relationship where the plate portions 51 are parallel to each other while spaced apart by an interval of 10 mm to 12 mm from each other in the upper/lower direction D2. It should be noted that a member 59 having a plate shape is disposed parallel to another plate portion 51 above the plate portion 51 positioned uppermost, and is a member which is positioned uppermost and serves as a guide when the substrate W to be inserted into the substrate storing space 27 is inserted.

In addition, 25 plate portions 51 provided in the first side wall 25 and 25 plate portions 51 provided in the second side wall 26 have a positional relationship facing each other in the left/right direction D3. In addition, 50 plate portions 51, and the member 59 having a plate shape and serving as a guide which is parallel to the plate portion 51 have a positional relationship parallel to the inner face of the lower wall 24. Bumps 511 and 512 are provided on an upper face of the plate portion 51. The substrate W supported by the plate portion 51 is in contact only with projecting ends of the bumps 511 and 512, and is not in face contact with the plate portion 51.

Figure 5:
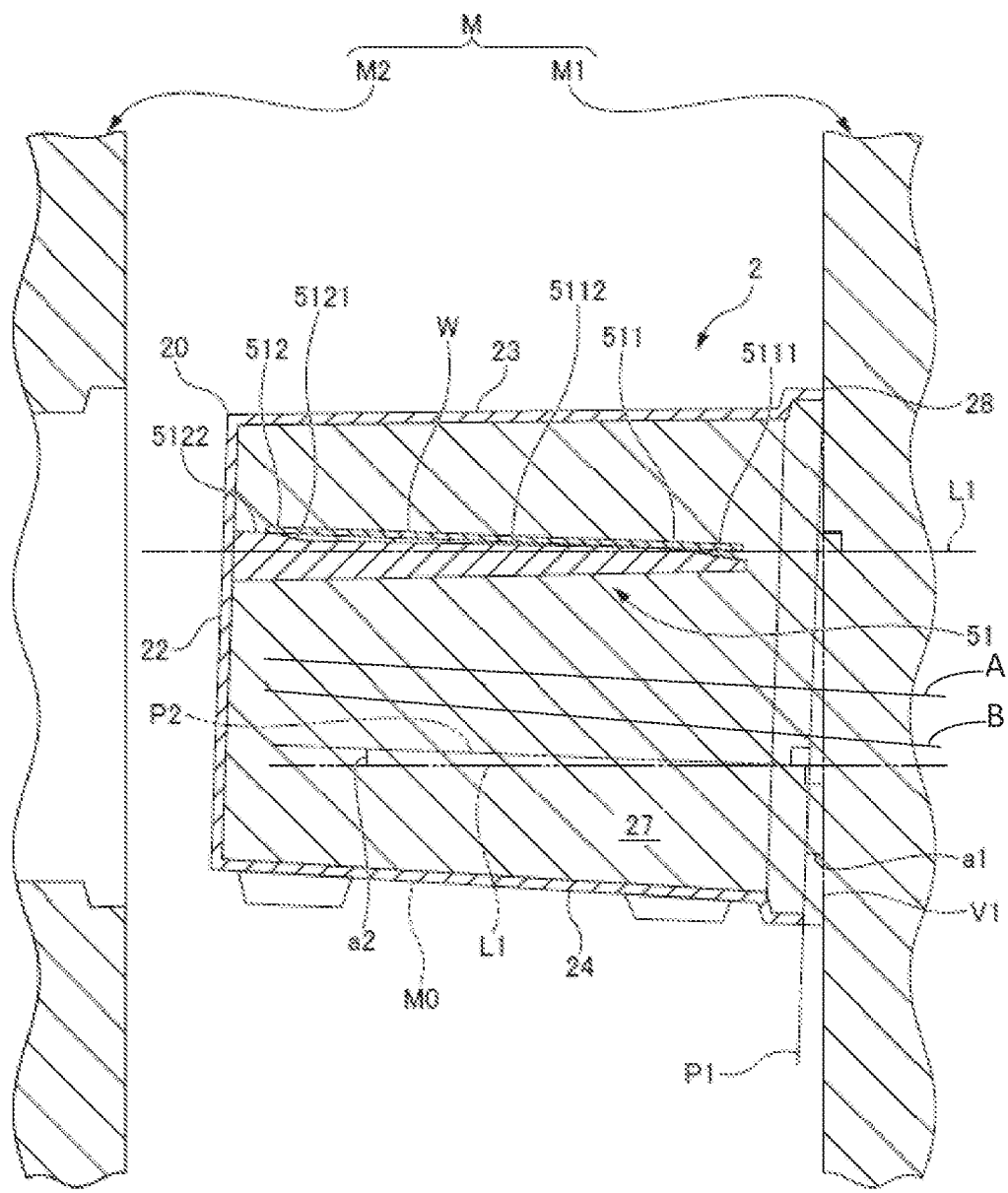
FIG. 5 is a schematic explanatory view illustrating a state where a mold M is open after the container main body 2 of the substrate storing container 1 according to one embodiment of the present invention has been molded in a mold space M0 of the mold M.
Figure 5:
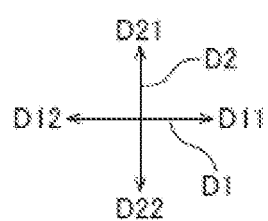

In more detail, each of the bumps 511 and 512 of the plate portion 51 has the shape of a ridge which is formed on the upper face of the plate portion 51, extends substantially in the left/right direction, and is inclined downward in the forward/backward direction. A peak portion of the ridge is formed by a curved face connecting upper end portions of inclined faces which are inclined downward in the forward/backward direction. As illustrated in FIG. 5, in the bump 511, a part of the upper face of the plate portion 51 facing the container main body opening portion 21 of the container main body 2 (facing the forward direction D11) is formed by one end portion-side inclined face 5111 which is a flat face. In the bump 511, a part of the upper face of the plate portion 51 extending toward the back wall 22 of the container main body 2 (facing the backward direction D12) is formed by the other end portion-side inclined face 5112 which is a flat face. FIG. 5 is a schematic explanatory view illustrating a state where the mold M is open after the container main body 2 of the substrate storing container 1 has been molded in a mold space M0 of the mold M. It should be noted that in FIG. 5, for the purpose of description, the substrate W is illustratively supported by the plate portion 51, but actually, in the container main body 2 molded on a movable die M1 of the mold M, the substrate W is not supported by the plate portion 51.

In addition, in the bump 512, a part of the upper face of the plate portion 51 facing the container main body opening portion 21 of the container main body 2 is formed by one end portion-side inclined face 5121 which is a flat face. A front end portion of one end portion-side inclined face 5121 is connected to a rear end portion of the other end portion-side inclined face 5112. In the bump 512, a part of the upper face of the plate portion 51 extending toward the back wall 22 of the container main body 2 is formed by the other end portion-side inclined face 5122 which is a flat face.

A movement direction line 5101 is formed, as illustrated in FIG. 6, on a lateral face that is positioned at an end edge of the plate portion 51 in the left/right direction. The movement direction line 5101 is formed parallel to a horizontal direction which is a direction where the movable die M1 is to be moved, as will be described later, when the mold is open for removal after the container main body 2 has been molded in the mold space M0 inside the mold M having a fixed die M2 and the movable die M1. Both of the other end portion-side inclined faces 5112 and 5122 are inclined, with respect to the movement direction line 5101 as a reference, on the same side as an inclined direction of a line P2 that extends in a direction perpendicular to a plane P1 penetrating the entire periphery of an end edge of the opening circumferential portion 28 of the container main body 2. FIG. 6 is an enlarged lateral view illustrating the plate portion 51 of the substrate support plate-like portion 5 of the substrate storing container 1. The mold space M0 is formed between the movable die M1 and the fixed die M2, actually, before the mold M is open, but for the purpose of description, in FIG. 5, the position of the container main body 2 is illustrated as the mold space M0.

"Being inclined on the same side" referred to herein implies that when it is considered that a line L1 is parallel to the horizontal direction parallel to the movement direction line 5101 as a reference, and a line A and a line B are inclined (not parallel to) with respect to the line L1, the line L1 and the line A and the line B certainly have an intersection if extended, but when progression is made along the line L1 from the intersection in one direction, if the line A and the line B stretch away from the line L1 on the same side of the line L1 as a boundary line, the line A and the line B are "inclined on the same side".

Specifically, in the present embodiment, if attention is paid to the line L1 (line L1 below in FIG. 5) along the horizontal direction parallel to the movement direction line 5101, and the line P2 that extends in the direction perpendicular to the plane P1 penetrating the entire periphery of the end edge of the opening circumferential portion 28 of the container main body 2, the line L1 and the line P2 have an intersection in the opening circumferential portion 28, but if progression is made along the line L1 from the intersection in the backward direction D12 which is one direction, the line P2 stretches away from the line L1 in above the line L1 as a boundary line in FIG. 5.

Subsequently, if attention is paid to the line L1 (line L1 below in FIG. 5) along the horizontal direction parallel to the movement direction line 5101, and the other end portion-side inclined face 5112, the line L1 and the other end portion-side inclined face 5112 have an intersection in a bump 111, but if progression is made along the line L1 from the intersection in the backward direction D12 which is one direction, the other end portion-side inclined face 5112 stretches away from the line L1 in above the line L1 as a boundary line in FIG. 5.

In addition, if attention is paid to the line L1 (line L1 below in the FIG. 5) along the horizontal direction parallel to the movement direction line 5101, and the other end portion-side inclined face 5122, when the other end portion-side inclined face 5122 is extended to substantially the forward direction D11, the line L1 and the other end portion-side inclined face 5122 have an intersection at which the other end portion-side inclined face 5122 intersects the line L1, which is not illustrated in FIG. 5. If progression is made along the line L1 from the intersection in the backward direction D12 which is one direction, the other end portion-side inclined face 5122 stretches away from the line L1 in above the line L1 as a boundary line in FIG. 5. As described above, the line P2, and the other end portion-side inclined face 5112 and the other end portion-side inclined face 5122 are inclined on the same side of the line L1 as a reference.

Herein, when it is considered that also each of one end portion-side inclined faces 5111 and 5121 intersects the line L1 at an intersection, if progression is made along the line L1 from the intersection in the backward direction D12, one end portion-side inclined faces 5111 and 5121 stretch away from the line L1 in above the line L1 as a boundary line in FIG. 5. For this reason, the line P2 and one end portion-side inclined faces 5111 and 5121 are inclined on the same side of the line L1 as a reference. For this reason, when the mold is open, as will be described later, by moving the movable die M1 along the line L1, all of one end portion-side inclined faces 5111 and 5121 and the other end portion-side inclined face 5112 and 5122 are not undercut and a draft is formed with respect to the line L1. It should be noted that similarly, also the lower face of the plate portion 51 is not undercut and a draft is formed.

An angle a1, at which the plane P1 is inclined in a lateral view illustrated in FIG. 5 with respect to a vertical line V1 as a reference which coincides with a vertical direction, is equal to an angle a2 at which the line P2 is inclined with respect to the line L1 as a reference along the horizontal direction. The angle a1 is from 0.1° to 1°, and in the present embodiment, is 0.6°. The reason the angle a1 is set at the value is that if the angle a1 is less than 0.1°, the bumps 511 and 512 are not capable of having a sufficient projection amount. In addition, the reason is that if the angle a1 exceeds 1°, there is a high possibility that an undercut part is formed in other parts of the container main body 2. For this reason, it is possible to reliably secure a draft in a wider range, and to smoothly perform removal by setting the angle a1 and the angle a2 in a range of 0.1° to 1°.

The substrate support plate-like portions 5 having such configuration are capable of supporting the edge portions of the plurality of substrates W in a positional relationship where the substrates W adjacent to each other among the plurality of substrates W are parallel to each other while spaced apart by the predetermined interval from each other.

As illustrated in FIG. 4, the back side substrate support portion 6 has a back side end edge support portion 60. The back side end edge support portion 60 is formed integrally molded with the plate portion 51 in a rear end portion of the plate portion 51 of the substrate support plate-like portion 5. It should be noted that the back side substrate support portion 6 may be formed separately from the substrate support plate-like portion 5, namely, the back side end edge support portion 60 may be formed of a rear retainer that is formed as a body (for example, separate component) separate from the plate portion 51 of the substrate support plate-like portion 5.

The back side end edge support portion 60 is provided so as to correspond to each piece of the substrates W that can be stored in the substrate storing space 27, specifically, 25 back side end edge support portions 60 are provided. The back side end edge support portions 60 disposed in the first side wall 25 and the second side wall 26 have a positional relationship where the back side end edge support portions 60 form a pair with the front retainer (not illustrated) to be described later in the forward/backward direction D1. If the substrates W are stored in the substrate storing space 27 and the lid body 3 is closed, the back side end edge support portions 60 support the substrates W while interposing end edges of the edge portions of the substrates W therebetween.

As illustrated in FIG. 2 and the like, the back wall 22 has a projecting portion 8 as a gas ejection nozzle portion. Two projecting portions 8 are paired, project in a rib shape toward the container main body opening portion 21, and extend parallel to each other from an upper end portion to a lower end portion of the back wall 22. Namely, the projecting portion 8 has a hollow column shape. An internal space of the projecting portion 8 is partitioned off into a front space and a back space by a partitioning wall portion 81.

The front space forms a pre-outlet gas retaining chamber 803, and the back space forms a gas retention chamber 801 communicating with the ventilation path 210 (refer to FIG. 4 and the like) that enables the substrate storing space 27 to communicate with the external space of the container main body 2. The projecting portion 8 has a plurality of opening portions 802 supplying gas, which has flown into the ventilation path 210, to the substrate storing space 27. The gas retention chamber 801 is a gas uniformity retaining portion capable of uniformly retaining the gas from the ventilation path 210 at a predetermined volume between the ventilation path 210 and the opening portions 802 of the projecting portion 8 by temporarily storing and pressurizing the purge gas, and forms the gas uniformity retaining portion forming a gas flow rate uniformity portion that enables the purge gas to flow out from the plurality of opening portions 802 at a uniform flow rate.

Inert gas such as nitrogen, dry air from which moistures are removed (less than or equal to 1%) (hereinbelow, referred to as purge gas), or the like as gas is capable of passing through the ventilation path 210. The ventilation path 210 has, as illustrated in FIG. 4, a gas inlet portion 211 and a horizontal extension portion 212. The horizontal extension portion 212 is connected to a lower end portion of the gas retention chamber 801.

The gas inlet portion 211 is formed by an internal space of a cylindrical gas supply device connection portion 202 which is formed in a rear end portion of the lower wall 24 and projects in the lower direction D22 to form the supply gas hole 242. The horizontal extension portion 212 extends on an outside of the lower wall 24 from an upper end portion of the gas inlet portion 211 in the backward direction D12 (right direction in FIG. 4) along an outer face (lower face) of the lower wall 24. The horizontal extension portion 212 is formed by a space between the outer face of the lower wall 24 and a lower flow path forming portion 203 that projects further downward than the lower wall 24. Then, the gas retention chamber 801 connected to the horizontal extension portion 212 is formed by the back space of the projecting portion 8 as described above, and extends from a rear end portion of the horizontal extension portion 212 to the upper end portion of the back wall 22 in the upper direction D21.

A very small inlet port 811 into which the purge gas flows from the gas retention chamber 801 is formed in the partitioning wall portion 81. A large number of the inlet ports 811 are formed, and the total area of the inlet ports 811 is smaller than the total area of the opening portions 802.

The supply gas hole 242 is formed by an opening of a lower end portion of the gas supply device connection portion 202. The supply gas filter portion 90 is fixed to the gas supply device connection portion 202. The exhaust gas hole 243 is formed by a through-hole of the lower wall 24. The exhaust gas filter portion 91 is fixed to the through-hole. The exhaust gas filter portion 91 enables the gas to pass through a ventilation membrane (not illustrated) provided inside the exhaust gas filter portion 91 in a direction from the external space of the container main body 2 toward the storing space 27 or in a direction from the storing space 27 toward the external space of the container main body 2. At that time, the ventilation membrane (not illustrated) prevents particles and the like contained in the gas from passing therethrough, and filters the gas.

The lid body 3 has, as illustrated in FIG. 1 and the like, substantially a rectangular shape that substantially coincides with the shape of the opening circumferential portion 28 of the container main body 2. The lid body 3 is removably attached to the opening circumferential portion 28 of the container main body 2. The lid body 3 is capable of closing the container main body opening portion 21 when the lid body 3 is installed in the opening circumferential portion 28. A sealing member 4 having an annular shape is attached to an inner face (back face of the lid body 3 illustrated in FIG. 1) of the lid body 3, namely, a face that is facing a face (sealing face 281) of a step part formed at a position immediately behind the opening circumferential portion 28 in the backward direction D12 when the lid body 3 closes the container main body opening portion 21. The sealing member 4 is made of various thermoplastic elastomers such as elastically deformable polyester and elastically deformable polyolefin, fluorine rubber, silicon rubber, or the like. The sealing member 4 is disposed so as to go around a circumferential edge portion of the lid body 3.

When the lid body 3 is installed in the opening circumferential portion 28, the sealing member 4 is interposed between the sealing face 281 and the inner face of the lid body 3 so as to be elastically deformed, and the lid body 3 air-tightly closes the container main body opening portion 21. If the lid body 3 is removed from the opening circumferential portion 28, the substrate W can be taken in and out from the substrate storing space 27 inside the container main body 2.

A latching mechanism is provided in the lid body 3. The latching mechanism is provided in the vicinities of both right and left end portions of the lid body 3. As illustrated in FIG. 1, the latching mechanism includes two upper side latch portions 32A which can project from an upper side of the lid body 3 in the upper direction D21, and two lower side latch portions (not illustrated) that can project from a lower side of the lid body 3 in the lower direction D22. Two upper side latch portions 32A are disposed in the vicinities of both right and left ends of the upper side of the lid body 3. Two lower side latch portions (not illustrated) are disposed in the vicinities of both right and left ends of the lower side of the lid body 3.

An operation portion 33 is provided in an outer face of the lid body 3. By operating the operation portion 33 from the front side of the lid body 3, it is possible to cause the upper side latch portions 32A and the lower side latch portions (not illustrated) to project from the upper side and the lower side of the lid body 3, respectively, and to make a state not projecting from the upper side and the lower side of the lid body 3. By the upper side latch portions 32A projecting from the upper side of the lid body 3 in the upper direction D21 to engage with the latch engagement concave portions 231A and 231B of the container main body 2 and the lower side latch portions (not illustrated) projecting from the lower side of the lid body 3 in the lower direction D22 to engage with the latch engagement concave portions 241A and 241B of the container main body 2, the lid body 3 is fixed to the opening circumferential portion 28 of the container main body 2.

A concave portion (not illustrated) which is concave outwardly from the substrate storing space 27 is formed on an inside of the lid body 3. The front retainer (not illustrated) is provided fixed to the concave portion (not illustrated) and a part of the lid body 3 outside the concave portion.

The front retainer (not illustrated) has a front retainer substrate receiving portion (not illustrated). Two front retainer substrate receiving portions (not illustrated) are disposed so as to form a pair while being spaced apart by a predetermined interval from each other in the left/right direction D3. 25 pairs of two front retainer substrate receiving portions disposed so as to form a pair as described above are provided arranged parallel to each other in the upper/lower direction D2. If the substrates W are stored in the substrate storing space 27 and the lid body 3 is closed, the front retainer substrate receiving portions support the substrates W while interposing end edges of edge portions of the substrates W therebetween.

The container main body 2 of the substrate storing container 1 described above is manufactured as follows by molding. Firstly, a container main body molding step is performed. In the container main body molding step, as illustrated in FIG. 5, in the mold space M0 inside the mold M having the fixed die M2 and the movable die M1, as described above, the container main body is molded in an inclined state where the container main body is rotated the angle a1 around an upper side of the opening circumferential portion 28 and a rear portion of the container main body containing the back wall 22 is lifted upward. The container main body molding step has been described above. Subsequently, a pullout step is performed. In the pullout step, in the mold space M0 inside the mold M, after the container main body 2 has been solidified, as illustrated in FIG. 5, the mold is open by moving the movable die M1 so as to retreat from the fixed die M2. A movement direction of the movable die M1 at that time is the horizontal direction, and is a direction along the line L1. For this reason, as described above, when the mold is open by moving the movable die M1 along the line L1, all of one end portion-side inclined faces 5111 and 5121 and the other end portion-side inclined faces 5112 and 5122 are not undercut and a draft is formed with respect to the line L1. Therefore, by moving the movable die M1 and opening the mold, it is possible to perform removal on the plate portion 51 of the container main body 2, with which the bumps 511 and 512 are integrally molded. It should be noted that also all other parts of the container main body 2 are not undercut, and it is possible to remove the entirety of the container main body 2 by moving the movable die M1 and opening the mold.

According to the substrate storing container 1 having the above-mentioned configuration according to the present embodiment, it is possible to obtain the following effects. As described above, the method for molding the substrate storing container 1 in which the container main body 2 and the lateral substrate support portion 5 are integrally molded has the container main body molding step of molding the container main body 2 in the mold space M0 inside the mold M having the fixed die M2 and the movable die M1 in a state where the line P2 parallel to the direction perpendicular to the plane P1 passing through the entire periphery of the end edge of the opening circumferential portion 28 of the container main body 2 is inclined in a direction a2 forming a predetermined angle, with respect to the horizontal direction which is the movement direction of the movable die M1 with respect to the fixed die M2, and the pullout step of pulling the container main body 2 molded in the mold space M0 out from the movable die M1 by moving the movable die M1 so as to retreat from the fixed die M2.

Then, the bumps 511 and 512 facing the container main body opening portion 21 of one end portion of the container main body 2 and the other end portion of the container main body 2, respectively, are formed by one end portion-side inclined faces 5111 and 5121 and the other end portion-side inclined faces 5112 and 5122 which are flat faces, respectively. A direction where the other end portion-side inclined faces 5112 and 5122 of the bumps 511 and 512 in the container main body 2 molded in the container main body molding step and present in the mold space M0 are inclined with respect to the line L1 parallel to the horizontal direction as a reference, and a direction where the line P2 along the direction perpendicular to the plane P1 passing through the entire periphery of the end edge of the opening circumferential portion 28 of the container main body 2 is inclined at the predetermined angle a1 (=angle a2) with respect to the line L1 as a reference are inclined on the same side of the line L1 as a reference.

According to the above-mentioned configuration, even though substrate contact portions of the upper face of the plate portion 51 forming the lateral substrate support portion are configured to have the bumps 511 and 512, respectively, in the pullout step of pulling out the container main body 2, the parts of the bumps 511 and 512 are not undercut and a draft is formed. For this reason, it is possible to pull out and remove the container main body 2, which is integrally molded with the plate portions 51 in which the bumps 511 and 512 are formed, from the movable die M1 as it is. As a result, since it is possible to configure the mold M for molding the container main body 2 of the substrate storing container 1 without providing a slide structure, it is possible to prevent the formation of burrs by preventing the formation of a parting portion of the mold M caused by the slide structure, and it is possible to reduce costs related to the mold M for molding the container main body 2 integrally molded with the plate portions 51 in which the bumps 511 and 512 are formed. Therefore, it is possible to easily pull out and remove the container main body 2 of the substrate storing container 1 from the movable die M1, and thus it is possible to reduce the costs related to manufacturing the container main body 2 of the substrate storing container 1.

In addition, the predetermined angle a1 (=angle a2) is from 0.1° to 1°. According to this configuration, the bumps 511 and 512 are capable of having a sufficient projection amount, and it is possible to prevent undercut from occurring in each portion of the container main body 2. For this reason, it is possible to reliably secure a draft in a wider range, and to smoothly perform removal by setting the angle a1 and the angle a2 in a range of 0.1° to 1°. In addition, it is possible to secure a sufficient gap between the plate portion 51 and the substrate W, which is required below the substrate W, and it is possible to attain point contact between the substrate W and the bumps 511 and 512.

The present invention is not limited to the embodiment described above, and modifications can be made without departing the technical scope described in the claims.

For example, in the present embodiment, two bumps, namely, the bump 511 and the bump 512 are provided in the plate portion 51, but the present invention is not limited to this configuration. For example, one bump may be provided in one plate portion.

In addition, the shapes of the container main body and the lid body, and the number of sheets and the dimensions of the substrates W which can be stored in the container main body are not limited to the shapes of the container main body 2 and the lid body 3, and the number of sheets and the dimensions of the substrates W which can be stored in the container main body 2 in the present embodiment. In addition, the substrate W in the present embodiment is a silicon wafer having a diameter of 300 mm, but the diameter is not limited to having this value.

In addition, in the present embodiment, two exhaust gas filter portions 91 are provided in the front portion of the lower wall 24, and two supply gas filter portions 90 are provided in the rear portion of the lower wall 24, but the present invention is not limited to this configuration. For example, two exhaust gas filter portions 91 may be provided in the rear portion of the lower wall 24, and two supply gas filter portions 90 may be provided in the front portion of the lower wall 24. In addition, two exhaust gas filter portions and two supply gas filter portions may not be provided. In addition, the exhaust gas filter portions 91 are not limited to being attached to the lower wall 24. The exhaust gas filter portions 91 may be attached to wall portions other than the lower wall 24, or the lid body, and for example, may be attached to both of the lower wall and the lid body.

EXPLANATION OF REFERENCE NUMERALS

1 SUBSTRATE STORING CONTAINER
2 CONTAINER MAIN BODY
3 LID BODY
5 SUBSTRATE SUPPORT PLATE-LIKE PORTION
21 CONTAINER MAIN BODY OPENING PORTION
27 SUBSTRATE STORING SPACE
28 OPENING CIRCUMFERENTIAL PORTION
511, 512 BUMP (SUBSTRATE CONTACT PORTION)
5101 MOVEMENT DIRECTION LINE
5111, 5121 ONE END PORTION-SIDE INCLINED FACE
5112, 5122 THE OTHER END PORTION-SIDE INCLINED FACE
D1 FIXED DIE
D2 MOVABLE DIE
L1 LINE
M MOLD
M0 MOLD SPACE
P1 PLANE
P2 LINE
W SUBSTRATE
a1, a2 ANGLE

The invention claimed is:
1. A method for molding a substrate storing container including a container main body inside which a substrate storing space capable of storing a plurality of substrates is formed, and which has an opening circumferential portion, in which a container main body opening portion is formed to communicate with the substrate storing space, in one end portion,
 a lid body removably attached to the opening circumferential portion, and capable of closing the container main body opening portion in a positional relationship where the lid body is surrounded by the opening circumferential portion, and
 lateral substrate support portions provided molded integrally with the container main body so as to form a pair in the substrate storing space, and capable of supporting edge portions of the plurality of substrates in a state where the substrates adjacent to each other among the plurality of substrates are arranged parallel to each other while spaced apart by a predetermined interval from each other when the container main body opening portion is not closed by the lid body,
 wherein each of the lateral substrate support portions is formed into a plate shape extending in a direction connecting the container main body opening portion of one end portion of the container main body to another end portion with respect to the one end portion of the container main body, and having an upper face and a lower face, wherein an upper face of the lateral substrate support portion has a substrate contact portion in contact with the substrate when supporting the edge portion of the substrate, and wherein the substrate contact portion has a bump, a peak portion of the bump is in contact with the substrate when supporting the edge portion of the substrate, and the container main body and the lateral substrate support portion are molded together, the method comprising:

a container main body molding step of molding the container main body in a mold space inside a mold having a fixed die and a movable die in a state where a direction perpendicular to a plane passing through the entire periphery of an end edge of the opening circumferential portion of the container main body is inclined in a direction forming a predetermined angle, with respect to a horizontal direction which is a movement direction of the movable die with respect to the fixed die; and a pullout step of pulling the container main body molded in the mold space out from the movable die by moving the movable die so as to retreat from the fixed die.

2. The method for molding a substrate storing container according to claim 1, wherein the bumps facing the container main body opening portion of one end portion of the container main body are formed by one end portion-side inclined face and an other end portion-side inclined face, respectively, which are flat faces, and wherein a direction where the other end portion-side inclined face of the bump in the container main body molded in the container main body molding step and present in the mold space is inclined with respect to the horizontal direction as a reference, and a direction where the direction perpendicular to the plane passing through the entire periphery of the end edge of the opening circumferential portion of the container main body in the mold space is inclined with respect to the horizontal direction as a reference are inclined on the same side of the horizontal direction as a boundary line.

3. The method for molding a substrate storing container according to claim 1, wherein the predetermined angle is from 0.1° to 1°.

4. A mold for molding a substrate storing container including a container main body inside which a substrate storing space capable of storing a plurality of substrates is formed, and which has an opening circumferential portion, in which a container main body opening portion is formed to communicate with the substrate storing space, in one end portion, a lid body removably attached to the opening circumferential portion, and capable of closing the container main body opening portion in a positional relationship where the lid body is surrounded by the opening circumferential portion, and lateral substrate support portions provided molded integrally with the container main body so as to form a pair in the substrate storing space, and capable of supporting edge portions of the plurality of substrates in a state where the substrates adjacent to each other among the plurality of substrates are arranged parallel to each other while spaced apart by a predetermined interval from each other when the container main body opening portion is not closed by the lid body, wherein each of the lateral substrate support portions is formed into a plate shape extending in a direction connecting the container main body opening portion of one end portion of the container main body to the other end portion with respect to the one end portion of the container main body, and having an upper face and a lower face, in which an upper face of the lateral substrate support portion has a substrate contact portion in contact with the substrate when supporting the edge portion of the substrate, and in which the substrate contact portion has a bump, a peak portion of the bump is in contact with the substrate when supporting the edge portion of the substrate, and the container main body and the lateral substrate support portion are molded together, the mold comprising:

a fixed die;

a movable die movable with respect to the fixed die; and a mold space which is formed inside the mold by the fixed die and the movable die, and in which the container main body is molded in a state where a direction perpendicular to a plane passing through the entire periphery of an end edge of the opening circumferential portion of the container main body is inclined in a direction forming a predetermined angle, with respect to a horizontal direction which is a movement direction of the movable die with respect to the fixed die.

5. The mold according to claim 4, wherein the bumps facing the container main body opening portion of one end portion of the container main body are formed by one end portion-side inclined face and an other end portion-side inclined face, respectively, which are flat faces, and wherein a direction where the other end portion-side inclined face of the bump in the container main body present in the mold space is inclined with respect to the horizontal direction as a reference, and a direction where the direction perpendicular to the plane passing through the entire periphery of the end edge of the opening circumferential portion of the container main body present in the mold space is inclined with respect to the horizontal direction as a reference are inclined on the same side of the horizontal direction as a boundary line.

6. The mold according to claim 4, wherein the predetermined angle is from 0.1° to 1°.

7. A substrate storing container comprising:

a container main body inside which a substrate storing space capable of storing a plurality of substrates is formed, and which has an opening circumferential portion, in which a container main body opening portion is formed to communicate with the substrate storing space, in one end portion;

a lid body removably attached to the opening circumferential portion, and capable of closing the container main body opening portion in a positional relationship where the lid body is surrounded by the opening circumferential portion; and lateral substrate support portions provided molded integrally with the container main body so as to form a pair in the substrate storing space, and capable of supporting edge portions of the plurality of substrates in a state where the substrates adjacent to each other among the plurality of substrates are arranged parallel to each other while spaced apart by a predetermined interval from each other when the container main body opening portion is not closed by the lid body, wherein each of the lateral substrate support portions is formed into a plate shape extending in a direction connecting the container main body opening portion of one end portion of the container main body to the other end portion with respect to the one end portion of the container main body, and having an upper face and a lower face, wherein an upper face of the lateral substrate support portion has a substrate contact portion in contact with the substrate when supporting the edge portion of the substrate, wherein the substrate contact portion has a bump, and a peak portion of the bump is in contact with the substrate when supporting the edge portion of the substrate, wherein the bumps facing the container main body opening portion of one end portion of the container main body and the other end portion of the container main body are formed by one end portion-side inclined face and the other end portion-side inclined face, respectively, which are flat faces, and the bump is formed by a part of a ridge formed by connecting the one end portion-side inclined face to the other end portion-side inclined face, and wherein a direction where the other end portion-side inclined face of the bump in the container main body is inclined with respect to a movement direction line as a reference which is formed parallel to a horizontal direction which is a direction where a movable die is moved after the container main body has been molded in a mold space inside a mold having a fixed die and the movable die, and a direction perpendicular to a plane passing through the entire periphery of an end edge of the opening circumferential portion of the container main body with respect to the movement direction line as a reference are inclined on the same side of the movement direction line as a boundary line.

8. The substrate storing container according to claim 7, wherein a predetermined angle is formed by the movement direction line, and the direction perpendicular to the plane passing through the entire periphery of the end edge of the opening circumferential portion of the container main body, and wherein the predetermined angle is from 0.1° to 1°.

* * * * *